United States Patent [19]
Buck

[11] Patent Number: 4,679,012
[45] Date of Patent: Jul. 7, 1987

[54] MAGNETOSTATIC-WAVE DEVICE

[75] Inventor: Daniel C. Buck, Anne Arundel, Md.

[73] Assignee: Westinghouse Electric Corp., Pittsburgh, Pa.

[21] Appl. No.: 845,919

[22] Filed: Mar. 31, 1986

[51] Int. Cl.⁴ .......................... H01P 1/20; H01P 9/00; H01P 1/218

[52] U.S. Cl. .................................... 333/161; 333/164; 333/202; 333/245; 357/27

[58] Field of Search .............. 333/202, 148, 161, 24.1, 333/201, 164, 205, 138–140, 141, 147, 150–155, 193–196, 201, 204, 245–247, 186; 364/819, 821, 823, 824; 310/26; 357/27; 331/96, 107 DP, 107 A

[56] References Cited

U.S. PATENT DOCUMENTS

| | | | |
|---|---|---|---|
| 3,864,647 | 2/1975 | Bongianni | 333/141 |
| 4,028,639 | 6/1977 | Hagon et al. | 331/109 A |
| 4,137,470 | 1/1979 | Désormière | 310/26 |
| 4,152,676 | 5/1979 | Morganthaler et al. | 333/202 X |
| 4,199,737 | 4/1980 | Patterson et al. | 333/154 |
| 4,207,546 | 6/1980 | Grudowski | 333/152 |
| 4,209,759 | 6/1980 | Vollvet | 333/153 |
| 4,283,692 | 8/1981 | Adam | 333/17 L |
| 4,291,283 | 9/1981 | Castera | 331/96 |
| 4,314,214 | 2/1982 | Castera et al. | 333/141 |
| 4,316,162 | 2/1982 | Vollvet et al. | 333/201 |
| 4,328,473 | 5/1982 | Montress et al. | 333/154 |
| 4,465,986 | 8/1984 | Loh et al. | 333/148 |

FOREIGN PATENT DOCUMENTS 143819  10/1980  Japan .
1330142  9/1973  United Kingdom .

OTHER PUBLICATIONS

Adam et al.–"Magnetostatic-Wave Devices Move Microwave Design into the Gigahertz Realm", Electronics May 8, 1980; pp. 123–128.

Adam–"A Temperature Stabilized Magnetostatic Wave Device", 1979 IEEE MTT-S International Microwave Symposium Digest, Orlando, FL, USA (30 Apr.–2 May 1979); pp. 160–161.

Primary Examiner—Marvin L. Nussbaum
Attorney, Agent, or Firm—W. G. Sutcliff

[57] ABSTRACT

Transversal characteristic filter using a magnetostatic-wave device having amplitude weighted transducer assemblies. The input transducer includes a multi-fingered conductive layer with each finger being equally dimensioned and spaced. Each finger is separately connected to a contact of a field effect transistor integrated onto a semiconductor chip. A separate transistor is available for connection to each finger. The contact widths of the transistors vary depending upon the location of the connected finger from the center-most finger. A distribution approaching sin(x)/x is desirable in most applications. At the output or combining end of the device, the transducer fingers are separately connected to the gates of individual transistors whose junction widths vary symmetrically about the width of the junctions of the transistor connected to the center-most finger. Phase reversal is provided for fingers which are sufficiently displaced to be aligned with the side lobes of the sin(x)/x current distribution, at both the input and output transducers.

22 Claims, 8 Drawing Figures

MAGNETOSTATIC-WAVE DEVICE

BACKGROUND OF THE INVENTION

This invention relates, in general, to microwave signal processing and, more specifically, to magnetostatic-wave devices used for filtering, delaying, and enhancing microwave signals.

One of the traditional methods of processing microwave frequency signals required the use of mixers or converters to lower the signal frequency to a more workable range. At this lower range, delay lines, transversal filters, and signal-to-noise enhancers could be constructed according to surface-accoustic-wave (SAW) techniques. It is now possible, however, to process the microwave frequency information directly without converting to a lower frequency by using magnetostatic-wave (MSW) devices which are capable of performing the processing functions at the speed required for operation at microwave frequencies.

Compared with SAW technology, MSW technology offers lower propagating losses, simpler transducers which do not require narrow line width photolithography, and broader frequency tunability by means of an externally applied magnetic field. In addition, when signals are processed at microwave frequencies, the signals are processed in near real time, thereby allowing faster decision making capability than with previous techniques. The elimination of the mixer also reduces any errors introduced into the receiving system by distortion caused by the mixer.

Although magnetostatic-wave devices offer certain advantages over conventional technology for processing microwave signals, MSW devices still present certain limitations and problems to their users in MSW filter applications. One of these limitations involves the bandpass shape characteristics of the MSW filter. Every MSW filter has a transducer located at each end of the ferrimagnetic material used in the MSW filter. It has been determined that the passband of the MSW filter is determined mostly by the response of the transducers. In order to improve the passband characteristics, multi-fingered transducers have become popular and offer passband performance exceeding that of MSW filters using single conductor transducers. The multi-fingered transducer behaves very much like an axis phased array, with the individual fingers providing the element factor, and the spatial array of fingers providing the array factor. The element factor, for realizable finger widths on the order of 1 to 2 mils, has a bandwidth of 1 to 2 GHz. Thus, the array factor provides an important contribution to useful filter response.

The Fourier transform of the array factor determines the filter passband characteristics by either variations in finger spacing or by tapering the individual finger element amplitudes which act upon the ferrimagnetic material of the MSW filter. For mid to high microwave frequencies, spacing variations require increased high resolution photolithography, so in many cases it is desirable to resort to amplitude tapering as the means for determining the array factor of the transducer. Amplitude tapering, or weighting, has traditionally been done by varying the finger length. U.S. Pat. No. 4,314,214, issued on Feb. 2, 1982, discloses, in FIG. 8, a magnetostatic-wave device using a multi-fingered transducer with amplitude weighting created by the different finger lengths of the transducer. Amplitude weighting is also discussed briefly in the article "Magnetostatic-Wave Devices Move Microwave Design Into Gigahertz Realm," Electronics, May 8, 1980, page 127, column 2, where it is stated that a few of the parameters available for amplitude weighting are the finger width, length, and distance from the YIG, which is the ferrimagnetic material of the MSW.

Weighting of the finger elements by changing the finger length has two distinct disadvantages in MSW devices. First, there is a reduced power transmission due to the shorter fingers at the edge of the transducer. Second, the short fingers excite different mode spectra than the long fingers. These modes are analogous to ordinary electromagnetic modes in waveguides, and, in MSW, occur in the ferrimagnetic material. These higher order modes cause unwanted passbands which severely limit the usefulness of such filters. For example, analogous tapers in antennas have on the order of a 20 dB amplitude range. For such a range in an MSW filter, very short fingers would be needed in the transducers. Providing such would cause strong coupling to higher order MSW modes, which is an undesirable situation particularly since typical MSW filters and MSW delay lines use overmoded ferrimagnetic samples or materials to maintain acceptable insertion loss.

Therefore, it is desirable, and it is an object of this invention, to provide the amplitude taper or weighting in the MSW transducers by an arrangement which does not require changing the dimensions or spacing of the individual finger elements of the transducers. It is another object of the invention to provide for phase reversals in transducer element circuits to further approximate Fourier transforms of desired filter passband characteristics.

SUMMARY OF THE INVENTION

There is disclosed herein a new and useful magnetostatic-wave (MSW) device which exhibits amplitude weighting characteristics by its transducers without shortening any of the individual transducer finger elements, which would increase insertion loss. According to one embodiment of the invention, the transducers at each end of the MSW device use conducting surfaces, or fingers, which are spaced and dimensioned equally. Weighting of the signal contribution by each individual transducer finger is achieved by connecting the fingers individually to field effect transistors (FETs) having different junction widths.

In the transducer which is driving the ferrimagnetic material of the MSW device, the individual fingers are connected to the drain electrodes or contacts of the individual field effect transistors. All of the source contacts of the transistors are connected together and to ground potential. The gate electrodes or contacts of the transistors are all connected together and are supplied with the driving microwave signal and a common gate biasing voltage. The ends of the individual finger structures which are not connected to the FETs are all connected together and to an isolated source of positive voltage with the isolation provided by a low-pass LC filter element.

In the preferred embodiment, the FETs are integrated onto a common semiconductor chip and the junction widths for each FET are proportioned according to the amount of current amplitude control desired for each individual finger. In order to achieve the main lobe sin(x)/x distribution which is known in the art to produce an approximate rectangular passband in the MSW device, the junction widths of the individual transistors are varied according to the sin(x)/x criteria. This distribution produces a symmetrical decrease in junction width of the field effect transistors as they are located away from the transistor connected to the center-most finger structure.

In this same embodiment of the invention, the receiving, or combining, transducer of the MSW device has the individual finger structures connected to the gate contacts of separate FETs integrated onto a common semiconductor chip. Therefore, the current amplitudes induced into the conductive strips, or fingers, by the magnetic fields are combined into the resulting microwave output signal in proportion to the widths of the FETs to which they are connected. A distribution of FET junction widths approaching the main lobe sin(x)/x distribution is also desirable at the combining or output end of the MSW device and results in the transistors farthest from the transistor connected to the centermost finger having the smallest junction widths, assuming that the main lobe sin(x)/x distribution is desired. In this specific embodiment, the source electrodes or contacts of the FETs are all connected together and to ground potential, and the drain electrodes of all of the FETs are connected together and to an isolated positive voltage. The microwave signal output is derived from the AC isolated drain contacts of the FETs.

Other embodiments of the invention may be constructed by using different junction width distributions and current phase reversals for the FETs integrated onto the semiconductor chip. In addition, the individual fingers of the input transducer may be connected to the source contacts of the individual FETs instead of the drain contacts as in the other embodiment. According to the second embodiment, the gates of all the FETs would still be interconnected and supplied with the input microwave signal, but, instead of the sources, the drains of all the transistors would be connected together and to an isolated source of positive potential. In this second embodiment, the other end of the individual finger structures would be connected together and to ground potential. A similar reversing of the drain and source contacts of the transistors at the combining or output end of the MSW device can be used and constitutes still another embodiment of the invention.

BRIEF DESCRIPTION OF THE DRAWINGS

Further advantages and uses of this invention will become more apparent when considered in view of the following detailed description and drawings, in which.

DESCRIPTION OF THE PREFERRED EMBODIMENTS

Figure 1:
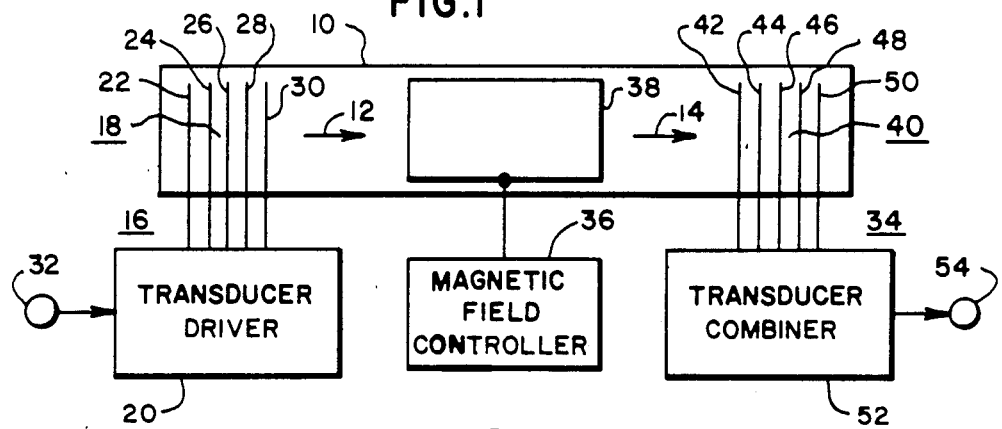
FIG. 1 is a general view of the major components of an MSW device constructed according to one embodiment of the invention.

Throughout the following description, similar reference characters refer to similar elements or members in all of the Figures of the drawings.

Referring now to the drawings, and to FIG. 1 in particular, there is shown a magnetostatic-wave (MSW) device constructed according to this invention. The MSW device includes a low-loss ferrimagnetic material 10 which is used to propagate slow, dispersive spin waves at microwave frequencies in the direction indicated by the arrows 12 and 14. Typically, the material 10 is an epitaxially grown yttrium-iron-garnet (YIG) layer on a gadolinium-gallium-garnet (GGG) substrate, although it is within the contemplation of this invention that other low-loss ferrimagnetic materials or comparable substrates may be used. Background information and some details on the operation of MSW devices is contained in the article "Magnetostatic-Wave Devices Move Microwave Design Into Gigahertz Realm," Electronics, May 8, 1980.

The MSW device of FIG. 1 includes an input or driving transducer assembly 16 consisting of the conducting elements 18 and the transducer driver 20. The conducting elements 18 couple the microwave signal to the YIG or ferrimagnetic material 10 for propagation to the other end. The conducting elements 18 are formed by thin conducting layers deposited on or near the material 10. The transducer includes, in this embodiment, the separate conducting structures, or fingers, 22, 24, 26, 28 and 30, although more or less than five separate fingers may be used in a particular application without departing from the scope of the invention. Each of the fingers, according to this invention, is driven by a separate transducer stage of the transistor driver 20. Therefore, each of the individual fingers is connected independently to the transducer driver 20 as shown in FIG. 1. The microwave signal entering terminal 32 is processed by the driver 20 and applied to the individual fingers of the transducer assembly 16.

The magnetic field propagating through the material 10 to the combining or output transducer assembly 34 is subjected to a controlled magnetic field in order to determine the overall response of the MSW device. The magnetic field controller 36, which is connected to the magnetic field producing plate or layer 38, provides this important function in the MSW device. The orientation, amplitude, direction, and location of the magnetic field is dependent upon the desired characteristics of the MSW device and can be varied accordingly without departing from the main teachings of this invention.

The combining or output transducer assembly includes the conducting elements 40 which are individually designated as the fingers 42, 44, 46, 48 and 50. Each of the fingers is individually connected into the transducer combiner 52 which combines the signals coupled to the separate fingers and produces a combined output to the terminal 54. Generally speaking, the device shown in FIG. 1 divides the microwave signal applied to terminal 32 into individual components which are applied separately to the fingers of the transducer assembly 16. The amplitude and phase of the current applied to the separate fingers is controlled by the transducer driver 20 so that the performance of the MSW device is optimized. The signals coupled into the fingers of the output transducer 34 are applied to the transducer combiner 52 where they are combined according to a predetermined distribution criteria to form the microwave output signal applied to terminal 54.

Figure 2:
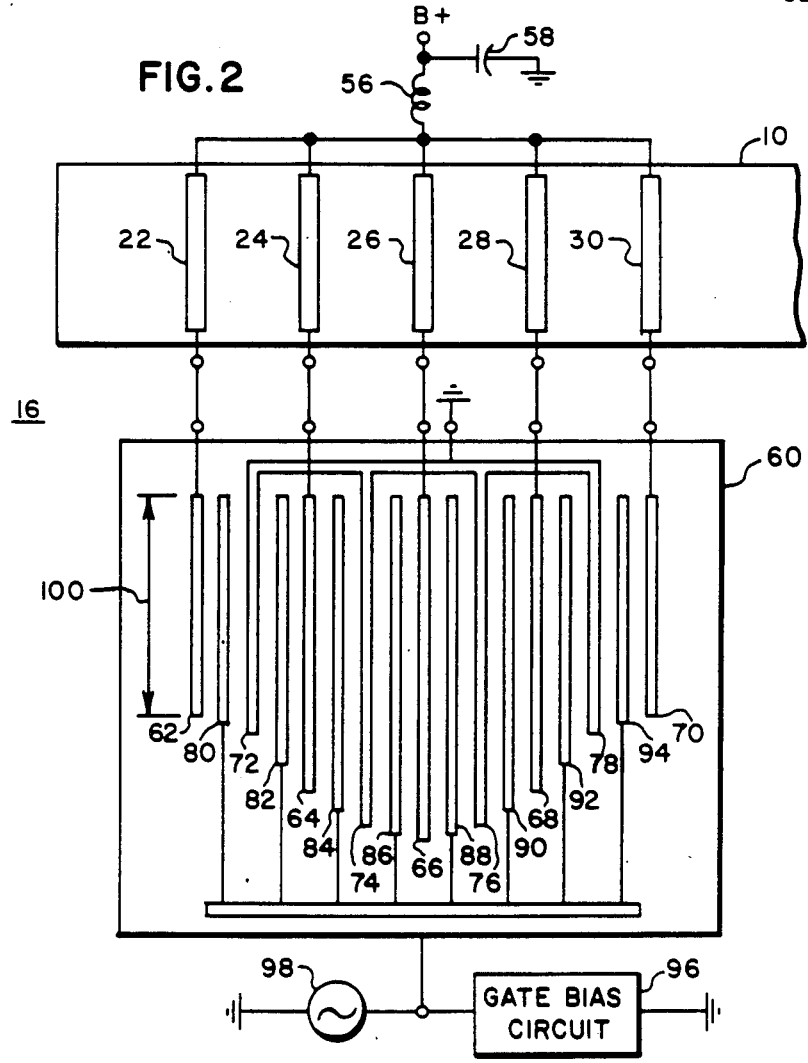
FIG. 2 is a detailed diagram of an input or driver transducer assembly constructed according to one embodiment of this invention.

FIG. 2 is a detailed diagram of the input transducer assembly 16 shown in FIG. 1. The separate conducting structures, or fingers, 22, 24, 26, 28 and 30, are positioned and oriented on the material 10 so that their lengths are perpendicular to the propagation of the signal through the magnetic material 10. The fingers extend across the material 10 and are all connected together at one of their ends. These ends are also connected to the inductor, or RF choke, 56 which is connected to a source of positive potential and to the bypass capacitor 58. The capacitor 58 may be connected to the other end of the inductor 56 in applications where a direct RF short of the fingers at one end is desirable.

The purpose of the positive voltage is to supply the operating voltage for the field effect transistors (FETs) which are used in the driver portion of the transducer assembly. The fingers on the magnetic material 10 each have the same length across the material 10 and have other equal dimensions, such as the spacing from the material 10 and the spacing from each other. Although only five fingers are shown, it is within the contemplation of the invention that more or less than five fingers may be used in constructing the conducting layer on the material 10.

The benefits of a multi-fingered conducting layer are well known to those skilled in the MSW art, and, unfortunately, the problems associated with conventional multi-fingered conducting layers are also well known to those skilled in the art. Basically, the separate finger structure allows the coupling of the microwave signal to the material 10 to have an amplitude and phase which is conducive to better operating characteristics of the MSW device. In order to achieve these results, it is necessary, even according to the prior art, to weight the amplitude or coupling of the fingers to the ferrimagnetic material 10. Typically, this involves shortening some of the finger structures which can result in unwanted coupling of the fingers to higher order MSW modes.

The invention disclosed herein makes use of fingers which are all of the same length, thereby reducing the higher mode coupling and lithography problems associated with shortened finger structures. As is shown in FIG. 2, each individual finger is connected to the drain contact of field effect transistors contained on the semiconductor chip 60. For example, the drain electrodes or contacts 62, 64, 66, 68 and 70 are connected to the fingers 22, 24, 26, 28 and 30, respectively. The FET source contacts 72, 74, 76 and 78 are all connected together on the chip 60 and are connected by an external connection to ground potential. In a similar fashion, the FETs have their gate contacts 80, 82, 84, 86, 88, 90, 92 and 94 all connected together and to a gate bias circuit 96 which puts the appropriate DC bias on the gates. In addition to the gate bias circuit 96, the gates are connected to the generator 98 which represents the source of microwave signal which is to be applied to the MSW device.

Because the performance of the transducer increases as the weighting of the amplitudes in the fingers decreases according to their distance from the center-most finger, the junction widths of the FETs which are connected to fingers away from the center-most finger become smaller the farther the finger is displaced. In this embodiment, finger 26 is the center-most conductor. The FETs associated with this conductor have the largest width of their transistor junctions of any of the transistors shown in FIG. 2 on chip 60. On the other hand, the junction widths for the transistors connected to the fingers 22 and 30 have the shortest width. The width is represented by the vertical dimension in FIG. 2, as shown by distance 100. Although standard terminology may indicate that this distance is the length of the junction contacts, standard nomenclature in the art of fabricating FETs refers to this dimension as the width of the junction, since it is the width dimension which mainly determines the current capabilities of the junction. Although the FETs are shown integrated onto a common semiconductor chip 60, it is within the contemplation of the invention that each of the FETs associated with the fingers may be constructed on a separate chip.

The widths of the FET junctions on the semiconductor chip 60, as previously stated, vary symmetrically about the drain contact which is connected to the center-most finger 26. The exact distribution, or curve, which determines the widths of the FET junctions as they progressively get farther from the center-most finger, or the symmetrical axis, is determined by the amount of current and amplitude weighting desired to be applied to the various fingers of the transducer assembly. Generally, a sin(x)/x distribution is the ideal distribution desired since it, in theory, causes a rectangular passband. However, since there are other properties of the system which affect the propagation of the signals, the ideal distribution of sin(x)/x may be modified somewhat to produce the optimum performance. Therefore, the junction widths of the FETs may not exactly duplicate the sin(x)/x distribution in some particular applications of the invention.

Figure 3:
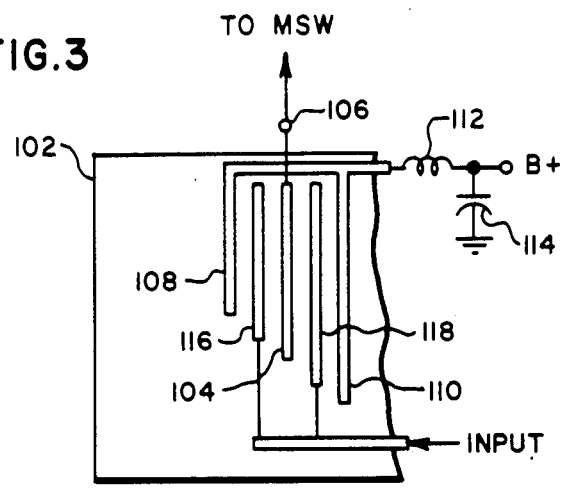
FIG. 3 is a diagram of a portion of an input or driver transducer assembly constructed according to another embodiment of this invention.

FIG. 3 is a diagram of a portion of the input transducer 16 shown in FIG. 1, constructed according to another embodiment of the invention. The main difference between this embodiment and the previous embodiment is that the drain and source contacts of the FETs on the substrate 102 are interchanged. In other words, the source contacts of the FETs, such as contact 104, are connected to the individual fingers, such as the one finger connected through the terminal 106 to the contact 104. Connection of the other four fingers to the other four source contacts is not illustrated in FIG. 3, but should be apparent from the symmetry and similarity of this embodiment with the embodiment shown in FIG. 2.

According to FIG. 3, all of the drain contacts, such as drain contacts 108 and 110, are connected together on the chip 102 and connected to a source of isolated positive voltage through inductor, or RF choke, 112 and across capacitor 114. The input microwave signal and the bias voltage are applied to the gate contacts, such as contacts 116 and 118, which control the current flowing between the source and drain contacts and, effectively, into the fingers of the conducting layer on the transducer assembly. Although not shown, the opposite ends of the fingers of the transducer assembly are all connected together and connected to ground potential to complete the current path through the FETs.

Figure 4:
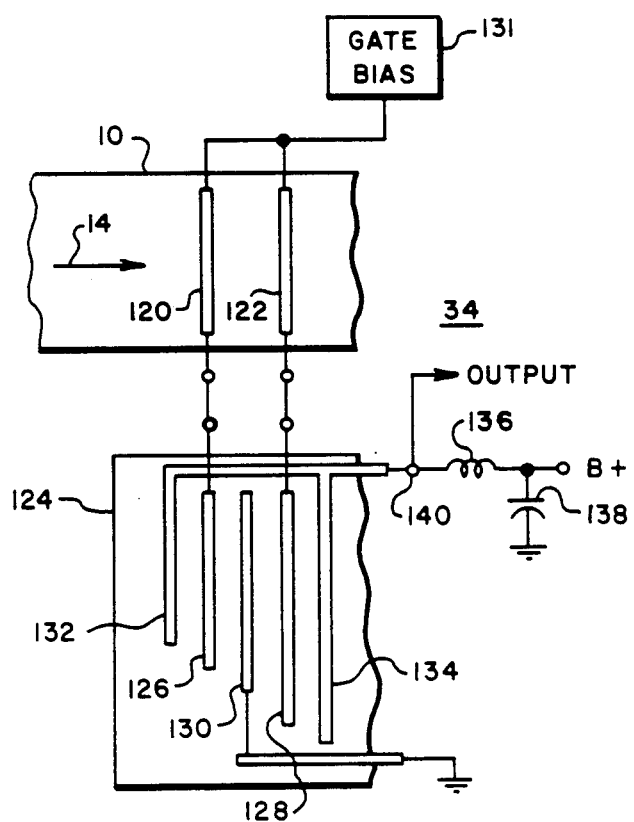
FIG. 4 is a diagram of a portion of an output or combining transducer assembly constructed according to this invention.

FIG. 4 is a diagram of a portion of the combining or output transducer assembly 34 shown in FIG. 1. The YIG or ferrimagnetic material 10 through which the signal propagates in the direction 14 contains or supports a multi-fingered conducting layer thereon which receives or has induced therein currents from the propagating magnetic waves. In particular, the fingers 120 and 122 are shown as a portion of the conductive portion of the output transducer. Ordinarily, more separate fingers would be used but are not shown in FIG. 4 in the interest of clarity.

Since the microwave signal is induced into the fingers 120 and 122 and transferred to the FETs integrated onto the chip 124, a DC biasing circuit, such as the gate bias 131, is connected to one end of the fingers. The other end of the fingers are connected to the gate contacts of the transistors integrated onto the chip 124, such as the gate contacts 126 and 128. In this particular embodiment, the source contact 130 is connected to ground potential and the drain contacts 132 and 134 are connected together and through the RF choke 136 to a positive voltage which is bypassed by capacitor 138. The output signal is available at terminal 140 for application to subsequent circuitry or processing apparatus. Although only two FETs are shown in FIG. 4, which are associated with the two fingers illustrated, more FETs would normally be used, with the junction width distribution around the FET connected to the centermost finger being symmetrical and similar to the distribution used for the driving or input transducer shown in FIG. 2. In other words, the sin(x)/x distribution of the junction widths of the FETs integrated onto chip 124 may be optimum distribution to give the best overall performance of the MSW device, although some variation from the ideal sin(x)/x distribution may be required in particular applications.

In the Figures of the drawings which illustrate the various contacts of the FETs, it appears that adjacent contacts are of different widths. In actual practice, the stepping of the width dimensions may not be as great as that illustrated for clarity in the Figures of the drawings. Therefore, it is the net effect of the junction widths upon the weighting of the finger currents that is of importance in the devices disclosed herein.

Figure 5:
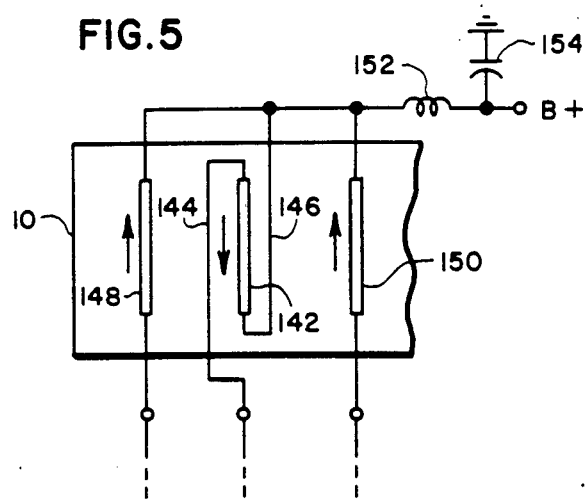
FIG. 5 is a diagram of a portion of an input transducer assembly constructed to provide phase reversal according to an embodiment of the invention.

Since a sin(x)/x distribution requires a phase reversal beginning at locations displaced one-fourth wavelength from the center of the main lobe of the distribution, the transducers must be capable of phase reversals when the transducer fingers include the side lobes of the current distribution. FIG. 5 illustrates one arrangement for providing such a phase reversal. According to FIG. 5, the finger 142 has its lead wires 144 and 146 connected differently than the lead wires of fingers 148 and 150. The result is a phase reversal in the current flowing through finger 142 compared to the current in fingers 148 and 150. With closely spaced fingers, there may be more than one finger connected for phase reversal. The inductor 152 and the capacitor 154 provide for connection to the positive DC voltage which is to be applied to the FET contacts through the transducer fingers.

Figure 6:
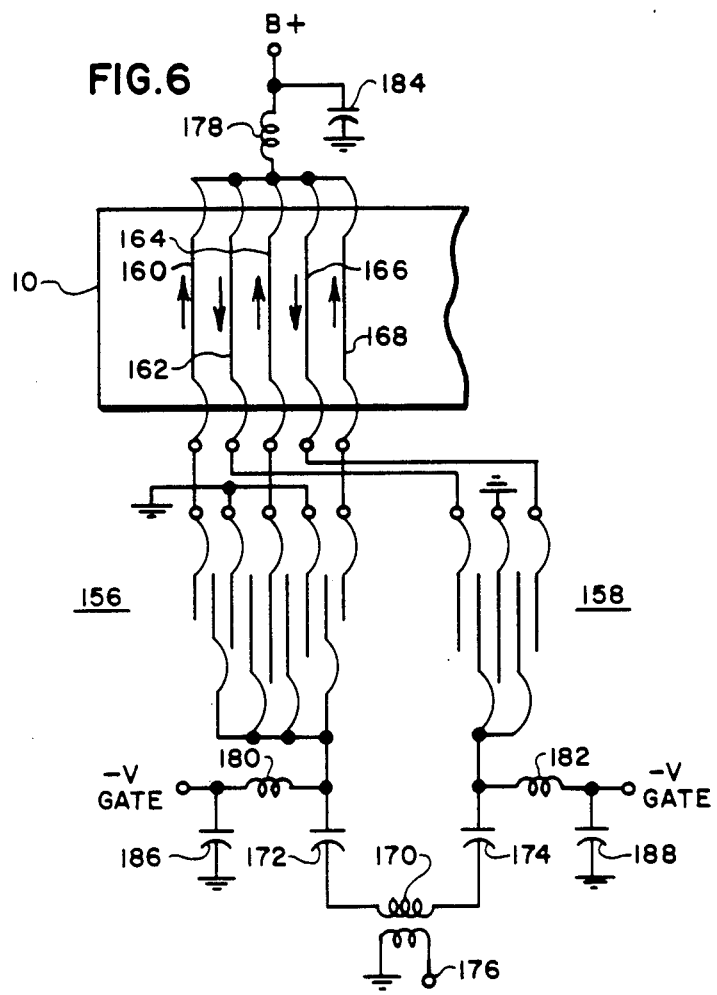
FIG. 6 is a diagram of an input transducer assembly constructed to provide phase reversal according to another embodiment of the invention.

FIG. 6 illustrates another arrangement for producing the desired phase reversals. The FETs driving the transducer fingers are grouped into two groups, FET group 156 and FET group 158. The FETs and the transducer fingers 160, 162, 164, 166 and 168 are illustrated in FIG. 6 in a schematic form which does not show any thickness to the fingers and FET contacts. The gates of the two FET groups are connected to the coil or winding 170, or its microwave circuit equivalent, through the blocking capacitors 172 and 174. When the input signal is applied to terminal 176, the signals applied to the gates of the two FET groups are 180 degrees out of phase. Therefore, the fingers driven by FET group 156 are reversal in phase from the fingers driven by the FET group 158. Chokes 178, 180 and 182, and capacitors 184, 186 and 188 complete the circuit and permit connection of the circuit to the required DC voltages.

Figure 7:
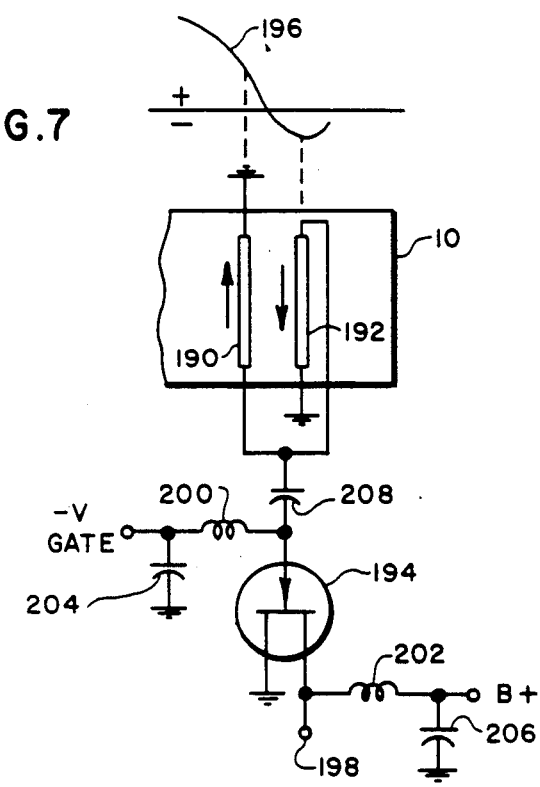
FIG. 7 is a diagram of a portion of an output transducer assembly constructed to produce phase reversal of the finger currents.

For optimum performance of an MSW filter, the distribution at the output or combining end of the MSW device should be similar to the input distribution. Therefore, when a sin(x)/x distribution extending to the phase reversal side lobes is used at the input transducer, phase reversal at the combining transducer is desired. FIG. 7 illustrates one arrangement for producing this desired phase reversal. The fingers 190 and 192 are connected at opposite ends to the combining FET 194. The curve 196 represents a portion of the sin(x)/x distribution and, since finger 192 is displaced enough to be aligned with a phased reversal side lobe rather than the main lobe, finger 192 is connected for phase reversal. The combined signal is available at the output terminal 198. The DC voltages are provided with the help of inductors 200 and 202, and capacitors 204 and 206. Capacitor 208 is a DC blocking capacitor.

Figure 8:
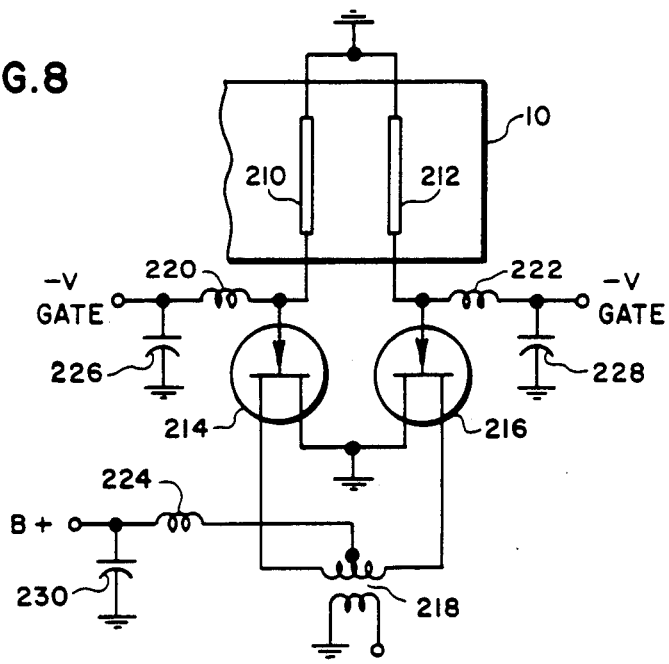
FIG. 8 is a diagram of a portion of another output transducer assembly constructed to produce phase reversal of the finger currents which are combined to produce the output signal.

Another arrangement for producing the phase reversal is illustrated in FIG. 8. The fingers 210 and 212 are connected to FETs 214 and 216 which are connected to the center-tapped transformer 218. Therefore, the currents from each finger are combined at the transformer 218 with an 180 degree phase shift. Inductors 220, 222 and 224, and capacitors 226, 228 and 230 are used to connect the circuit to the required DC operating voltages.

The teachings of this invention permit the weighting of the fingers in MSW transducers by performing the weighting functions in an FET chip where it can be done more conveniently and accurately than in the conductive layer of the transducer. It is emphasized that numerous changes may be made in the above-described device without departing from the teachings of the invention. It is intended that all of the matter contained in the foregoing description, or shown in the accompanying drawings, shall be interpreted as illustrative rather then limiting.

I claim as my invention:

1. A magnetostatic-wave device for propogating at least one microwave signal between input and output terminals, said device comprising:

a ferrimagnetic material through which said microwave signal travels from an input end to an output end;

means for applying a magnetic field to said ferrimagnetic material between said input and said output ends;

an output transducer located at said output end of said ferrimagnetic material, said output transducer transferring said microwave signal in said ferrimagnetic material to said output terminal;

an input conductive layer located at said input end of said ferrimagnetic material, said conductive layer having a plurality of separate finger structures extending across said ferrimagnetic material in a direction perpendicular to the direction of travel of said microwave signal; and an active transistor controlled exciting means for separately controlling the amplitude and phase of the input microwave signal applied to each separate finger of said separate finger structures extending across said ferrimagnetic material.

2. The magnetostatic-wave device of claim 1 wherein said active transistor controlled exciting means includes separate three-contact field effect transistors each having one of their three contacts connected to each of said separate fingers of said separate finger structures of said input conductive layer.

3. The magnetostatic-wave device of claim 2 wherein said separate field effect transistors are integrated onto a common semiconductor chip.

4. The magnetostatic-wave device of claim 3 wherein said gate contacts of all of said field effect transistors are connected to said microwave input signal.

5. The magnetostatic-wave device of claim 2 wherein said separate fingers of said input conductive layer are individually connected to the drain contacts of said separate transistors, and wherein said source contacts of the transistors are connected together.

6. The magnetostatic-wave device of claim 2 wherein said separate fingers of said input conductive layer are individually connected to the source contacts of the separate transistors, and wherein said drain contacts of said transistors are connected together.

7. The magnetostatic-wave device of claim 2 wherein said means for separately controlling the amplitude applied to each of said fingers includes changing the contact widths of the transistors connected to the fingers.

8. The magnetostatic-wave device of claim 7 wherein the distribution of the contact widths of said separate transistors is symmetrical on both sides of the transistor connected to the center-most finger structure.

9. The magnetostatic-wave device of claim 8 wherein the contact widths of said transistors vary to provide a distribution equal to $\sin(x)/x$ across said input conductive layer.

10. The magnetostatic-wave device of claim 1 wherein the dimensions and spacing of each of said finger structure are the same.

11. The magnetostatic-wave device of claim 1 wherein at least one of said fingers of the conductive layer is connected so that the current in said finger is 180 degrees out of phase with said current in an adjacent finger.

12. The magnetostatic-wave device of claim 11 wherein two groups of field effect transistors are used to excite one finger structures, with each group being separately driven in 180-degree phase relation by signals from effectively opposite ends of a transformer device.

13. The magnetostatic-wave device of claim 1 wherein the output transducer includes:
an output conductive layer located at the output end of the ferrimagnetic material; and
separate three-contact field effect transistors each having their gate contacts connected to said separate finger structure of said output conductive layer and each having one of their contacts connected together and to the output terminal.

14. The magnetostatic-wave device of claim 13 wherein said separate three contact field effect transistors are integrated onto a common semiconductor chip.

15. The magnetostatic-wave device of claim 14 wherein the contact widths of said transistors connected to the output fingers are changed to control the amplitude and phase of the finger signal component which is combined to produce the signal at said output terminal of the magnetostatic-wave device.

16. The magnetostatic-wave device of claim 15 wherein said contact widths of said separate three contact transistors are symmetrical on both sides of said transistor which is connected to said center-most output finger structure.

17. The magnetostatic-wave device of claim 16 wherein said contact widths of said transistors vary to provide a distribution equal to $\sin(x)/x$.

18. The magnetostatic-wave device of claim 17 wherein at least one of said fingers of said output conductive layer is connected so that the current in said finger is combined 180 degrees out of phase with the current in an adjacent finger.

19. A magnetostatic-wave device including a ferrimagnetic material having an input transducer located at one of its ends and an output transducer located at its other end, said device having means for applying a magnetic field to the ferrimagnetic material between its ends, and said input transducer comprising:
a conductive layer located on the ferrimagnetic material, said layer being divided into a plurality of separate finger structures which extend across the ferrimagnetic material in a direction which is perpendicular to the direction of propagation of the signal in the ferrimagnetic material produced by said input transducer;
a symmetrical array of field effect transistors each having gate, source and drain contacts integrated onto a common semiconductor chip, with the junction widths of the transistors being dependent upon their location in the array;
means for connecting together the gate contacts of each transistor and for connecting said gate contacts to an input microwave signal;
means for connecting together one of the other two contacts of all of said transistors;
means for connecting the remaining contacts of said transistors to a separate finger structure of the conductive layer;
said junction widths of said transistors being dimensioned to apply the desired amplitude of the microwave input signal to the finger structures connected to the transistors.

20. The magnetostatic-wave device of claim 19 wherein the junction widths of the transistors are smaller for transistors connected to finger structures located farther from the center-most finger structure.

21. The magnetostatic-wave device of claim 19 wherein the transistor contact widths are varied to provide a signal distribution equal to $\sin(x)/x$ across the multi-fingered conductive layer.

22. The magnetostatic-wave device of claim 21 wherein at least one of the finger structures is connected so that the current in said finger is 180 degrees out of phase with the current in an adjacent finger.

* * * * *